(12) United States Patent
Kim et al.

(10) Patent No.: US 7,170,384 B2
(45) Date of Patent: Jan. 30, 2007

(54) PRINTED CIRCUIT BOARD HAVING THREE-DIMENSIONAL SPIRAL INDUCTOR AND METHOD OF FABRICATING SAME

(75) Inventors: Han Kim, Daejeon (KR); Byoung Youl Min, Kyunggi-do (KR); Young Woo Kim, Chungcheongnam-do (KR); Young Jae Lee, Chungcheongnam-do (KR); Chang Myung Ryu, Kyunggi-do (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 0 days.

(21) Appl. No.: 11/140,680

(22) Filed: May 27, 2005

(65) Prior Publication Data

US 2006/0145805 A1     Jul. 6, 2006

(30) Foreign Application Priority Data

Dec. 30, 2004  (KR) .................. 10-2004-0116806

(51) Int. Cl.
*H01F 5/00* (2006.01)
(52) U.S. Cl. .................................... 336/200
(58) Field of Classification Search ............. 336/65, 336/83, 200, 232; 361/760–761
See application file for complete search history.

(56) References Cited

U.S. PATENT DOCUMENTS 3,992,691 A * 11/1976 Molthen ................ 336/200
5,446,311 A * 8/1995 Ewen et al. ............ 257/531
5,612,660 A   3/1997 Takimoto
6,031,445 A * 2/2000 Marty et al. ........... 336/200
6,291,872 B1 * 9/2001 Wang et al. ............ 257/531

FOREIGN PATENT DOCUMENTS

| JP | 04-237106 | 8/1992 |
| JP | 2003-158015 | 5/2003 |
| WO | WO-02/089157 | 11/2002 |

OTHER PUBLICATIONS

Patent Abstracts of Japan for 2002-324962 published on Nov. 8, 2002.
Patent Abstracts of Japan for 2003-209331published on Jul. 25, 2003.

* cited by examiner

*Primary Examiner*—Tuyen T Nguyen
(74) *Attorney, Agent, or Firm*—Darby & Darby

(57) ABSTRACT

A printed circuit board (PCB) having a three-dimensional spiral inductor, which includes a plurality of insulating layers and conductor layers. The PCB comprises a plurality of coil conductor patterns made of conductive material and shaped into strips, which is provided on the plurality of conductor layers, respectively, such that the plurality of coil conductor patterns are parallel to each other and positioned on the same plane perpendicular to the conductor layers, and in which each of the plurality of coil conductor patterns is longer than an adjacent inner coil conductor pattern.

8 Claims, 16 Drawing Sheets
(4 of 16 Drawing Sheet(s) Filed in Color)

Ring Loop

Meander Line

Spiral Inductor

PRINTED CIRCUIT BOARD HAVING THREE-DIMENSIONAL SPIRAL INDUCTOR AND METHOD OF FABRICATING SAME

INCORPORATION BY REFERENCE

The present application claims priority under 35 U.S.C. §119 to Korean Patent Application No. 2004-116806 filed on Dec. 30, 2004. The content of the application is incorporated herein by reference in its entirety.

BACKGROUND OF THE INVENTION

1. Field of the Invention

The present invention relates, in general, to a printed circuit board (PCB) having an inductor and a method of fabricating the same and, more particularly, to a PCB having an inductor, in which the inductor is formed by appropriately arranging spiral vertical structures so as to effectively use the space of the PCB, and a method of fabricating the same.

2. Description of the Prior Art

Used in electric and electronic circuits, a passive component is generally classified into a resistor, a capacitor, and an inductor. Of them, the capacitor and the inductor are the most basic components capable of storing and supplying energy. Since they have frequency characteristics, their materials depend on frequency, voltage, and electric current.

Meanwhile, current electronic devices are becoming small, light, and slim, and advances in fabrication and design technologies of the electronic devices promote miniaturization of the passive components used in the electronic devices. Particularly, miniaturization of the capacitor and the inductor is an important factor for determining the size of a product.

Unlike other passive components, the inductor is not fabricated as a ready-made product except in the very unusual case when the inductor is used for low power signals. Accordingly, the inductor is obtained through many steps of design, fabrication, test, evaluation, outsourcing and the like.

When two or more inductors are simultaneously connected to one core, the resulting structure acts as a transformer. The transformer is an important device which is used for electric insulation, impedance transformation, magnitude transformation of electric voltage and current, and filtering.

The inductor and the transformer have basically the same structure, in which they are wound around the core, but they are significantly different from each other in application.

The conventional inductor used in integrated circuit (IC) packages or printed circuit boards (PCBs) has a 2-D type structure in which micro-strips are layered on an external layer of a substrate. This inductor may be fabricated using patterns, such as micro-strips, while the patterns are formed long and straight. However, the inductor is mainly fabricated in one of the three types shown in FIG. 1 because of spatial limitations.

In the three types of inductors, the pattern is twisted so as to be formed long in a narrow space. Of them, a spiral inductor is frequently used because it is useful to form a long pattern. The spiral inductor is advantageous in that since it spirals in one direction while forming concentric circles, magnetic fields are added in the same direction by mutual inductance. Thereby, it is possible to form high inductance in the small area.

A meander line inductor winds and twists like a snake. However, the meander line inductor is disadvantageous in that since mutual inductances are generated in opposite directions and thus offset each other, it is difficult to form high inductance for a given size. A loop inductor has shape and performance that are poorer than the two preceding types, thus it is seldom used, but is employed as a filter sometimes.

Of the three types of inductor, the spiral inductor is most advantageous, but is problematic in that the two-dimensional spiral inductor occupies too large an area of the substrate to be applicable to miniaturized and complicated electronic current devices while insufficient inductance is assured.

To avoid the above disadvantages, Japanese Patent Laid-Open Publication No. 2002-324962 discloses a PCB having an inductor and a method of fabricating the same.

With respect to this, two types of inductor structures are provided. The first type is shown in FIGS. 2a and 2b, in which conductor wires 22a and conductor wires 26a are electrically connected using via holes 25 formed through an insulating layer 23, thereby creating inductor parts, resulting in the embedding of the inductor in the PCB.

In FIG. 2a, the insulating layer is omitted. In the method of fabricating the PCB, as shown in FIGS. 3a to 3f, a copper foil layer is layered on a first insulating layer 21 to form a conductor layer 22 (refer to FIG. 3a), a predetermined resister pattern is formed on the conductor layer 22, the conductor layer 22 is etched using the resister pattern as a mask, and the resister pattern is separated to form first conductor wires 22a (refer to FIG. 3b).

Additionally, a second insulating layer 23 is formed on the first insulating layer 21, on which the first conductor wires 22a have already been formed (refer to FIG. 3c), holes 24 are formed through the second insulating layer 23 at predetermined positions (refer to FIG. 3d), and the holes 24 are packed to form a via hole 25 and a conductor layer 26 is formed, by electroless and electrolytic copper plating processes (refer to FIG. 3e). The conductor layer 26 is patterned to form second conductor wires 26a, inductor parts are formed (refer to FIG. 3f), and wires and via holes are simultaneously formed on other substrates, thereby creating the PCB having the inductor.

The second type is shown in FIG. 4, in which ring-shaped conductor wires 31, 32, and 33 are formed on insulating layers (not shown), and are electrically connected to each other through via holes 41, 42, thereby creating an inductor. In the method of fabricating the PCB having the inductor, a terminal electrode 31b of the first ring-shaped conductor wire 31, which is formed on the first insulating layer, and a terminal electrode 32a of the second ring-shaped conductor wire 32, which is formed on the second insulating layer, are electrically connected through the via hole 41 formed through the second insulating layer. As well, a terminal electrode 32b of the second ring-shaped conductor wire 32, which is formed on the second insulating layer, and a terminal electrode 33a of the third ring-shaped conductor wire 33, which is formed on the third insulating layer, are electrically connected through the via hole 42 formed through the third insulating layer, thereby creating the inductor. As described above, the ring-shaped conductor wires are electrically connected through the via holes formed through the insulating layers, and the desired number of resulting layers are laminated, thereby forming inductor parts. Wires and via holes are simultaneously formed on other insulating layers, thereby creating the PCB having the inductor.

With respect to this, an inductor structure according to another conventional technology is disclosed in Japanese Patent Laid-Open Publication No. 2003-209331, entitled "a PCB and a method of fabricating the same".

A description will be given of other conventional technologies with reference to FIGS. 5 to 9. FIG. 5 illustrates a PCB according to another conventional technology, which shows a surface of a portion of the PCB including an inductor. As shown in FIG. 5, an inductor 51, which includes upper and lower wires, an insulating layer interposed between the upper and lower wires, and via holes for electrically connecting the upper and lower wires to each other therethrough, is embedded in the PCB. The PCB is provided with the inductor 51 and different resins, and the different resins consist of a resin 52 containing a magnetic substance and a resin 53 not containing the magnetic substance.

FIG. 6 is a sectional view taken along the line A–A' of FIG. 5, and FIG. 7 is a sectional view taken along the line B–B' of FIG. 5. As shown in FIGS. 6 and 7, a first insulating resin layer 54 is formed on a substrate 56, on which a wire pattern (not shown) is formed, and a second insulating resin layer 55 is formed thereon. The second insulating resin layer 55 is processed using an excimer laser to remove a portion thereof, through which the inductor is to be formed, and resin around the removed portion. Thereby, a groove is formed through the second insulating resin layer so that a lower wire 58 is exposed. A resin 52 containing a magnetic substance is packed in the groove and an upper wire 62 is then formed. In this case, the magnetic substance may be formed only between the via holes.

In a modified embodiment of FIG. 5, FIG. 8 is a sectional view taken along the line A–A' of the PCB of FIG. 5, in which a magnetic substance is provided in the first insulating resin layer 54 of FIG. 5. In this case, a conductor insulating layer 59 is formed in advance on a substrate 56 so as to have a larger area than a punched portion, thereby forming a first insulating resin layer. After a lower wire 58 is formed, a groove is formed using a low-priced carbon dioxide gas laser instead of the excimer laser so that a surface of the first insulating resin layer is exposed.

In this regard, the insulating resin 59 and the lower wire 58 act as a stopper, and a portion of the resin, on which the lower wire 58 is not formed, is melted by the carbon dioxide gas laser, thereby forming the groove so that the conductor insulating layer 59 on the substrate is exposed. After the formation of the groove, the second insulating resin layer is formed. The subsequent procedure is the same as in FIGS. 6 and 7.

Furthermore, in another modified embodiment of FIG. 5, as shown in FIG. 9, a first insulating resin layer is formed through the same procedure as FIGS. 6 and 7. After an upper wire 62 is formed, a groove is formed using a carbon dioxide gas laser, and a resin containing a magnetic substance is packed in the groove. In this case, the upper wire 62 and a lower wire 58 are used as a stopper to form the groove.

Thereby, a PCB, in which a resin under the upper wire of the inductor is different from a resin on the lower wire, is created.

However, in the above prior arts, even though the spiral inductor is most advantageous, the spiral inductor is problematic in that it occupies too large an area of a substrate to be applied to miniaturized and complicated current electronic devices, and thus insufficient inductance is assured.

SUMMARY OF THE INVENTION

Therefore, the present invention has been made keeping in mind the above disadvantages occurring in the prior arts, and an object of the present invention is to provide a PCB having a three-dimensional spiral inductor, which assures high inductance in a small area of IC packages or PCBs of miniaturized and complicated electronic devices, and a method of fabricating the same.

The above object can be accomplished by providing a PCB having a three-dimensional spiral inductor, which includes a plurality of insulating layers and conductor layers. The PCB comprises a plurality of coil conductor patterns made of conductive material and shaped into strips, which is provided on the plurality of conductor layers, respectively, such that the plurality of coil conductor patterns are parallel to each other and positioned on the same plane perpendicular to the conductor layers, and in which each of the plurality of coil conductor patterns is longer than an adjacent inner coil conductor pattern; a plurality of conductive through holes, which electrically connect the coil conductor patterns provided on the conductor layers symmetrically positioned with respect to a center of the printed circuit board, so that the plurality of coil conductor patterns and the plurality of conductive through holes form a spiral conductor all together; and a pair of lead out patterns, which are connected to an inner end and an outer end of the spiral conductor comprised of the plurality of coil conductor patterns and the plurality of conductive through holes, so as to allow external power to be supplied to the spiral conductor.

Furthermore, the present invention provides a method of fabricating a PCB having a three-dimensional spiral inductor. The method includes the steps of preparing a copper clad laminate, which consists of a first insulating layer and first conductor layers on both sides of the first insulating layer, and forming a plurality of first through holes for forming coil via holes; forming first plating layers on the copper clad laminate, and forming a plurality of strip-shaped first coil conductor patterns having a predetermined length on the first conductor layers and the first plating layers of the copper clad laminate so that the first coil conductor patterns are parallel to each other and connected to the first through holes at first ends thereof; laminating second insulating layers and second conductor layers on both sides of the resulting laminate; and forming a plurality of second through holes, which are connected to second ends of the first coil conductor patterns, through the second insulating layers, forming second plating layers, and forming a plurality of strip-shaped second coil conductor patterns on the second conductor layers and the second plating layers so that the second coil conductor patterns are parallel to the first coil conductor patterns formed on the copper clad laminate.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other objects, features and other advantages of the present invention will be more clearly understood from the following detailed description taken in conjunction with the accompanying drawings, in which.

DETAILED DESCRIPTION OF THE INVENTION

Hereinafter, a detailed description will be given of a PCB having a three-dimensional spiral inductor and a method of fabricating the same according to the present invention, with reference to the drawings.

Figure 1:
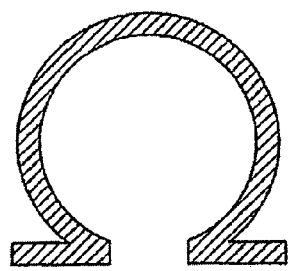
FIG. 1 illustrates a conventional plane inductor structure.
Figure 1:
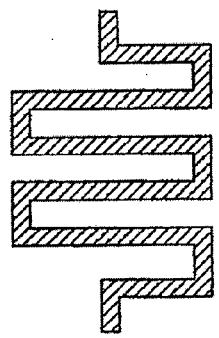
Figure 1:
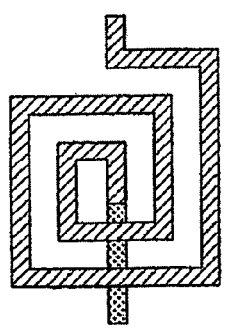
Figure 2A:
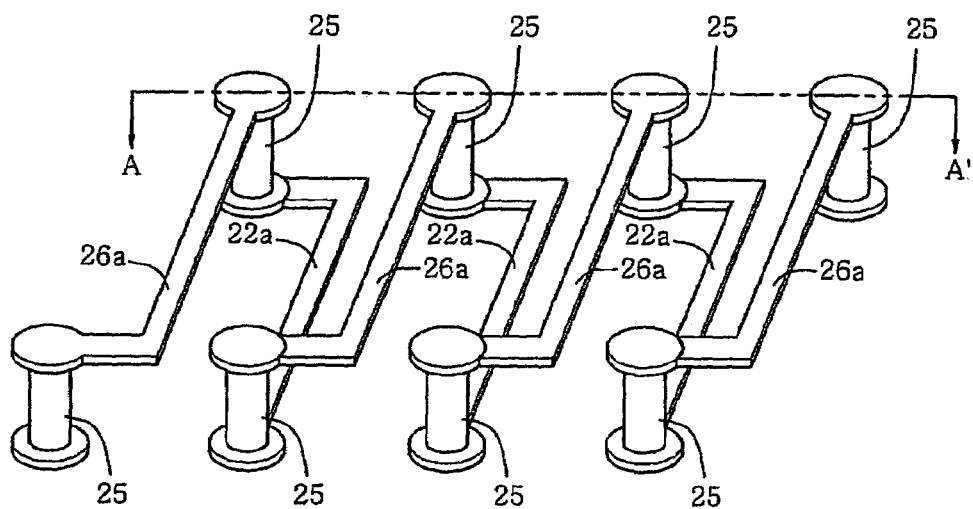
FIGS. 2a and 2b illustrate a three-dimensional inductor structure according to the conventional technology.
Figure 2B:
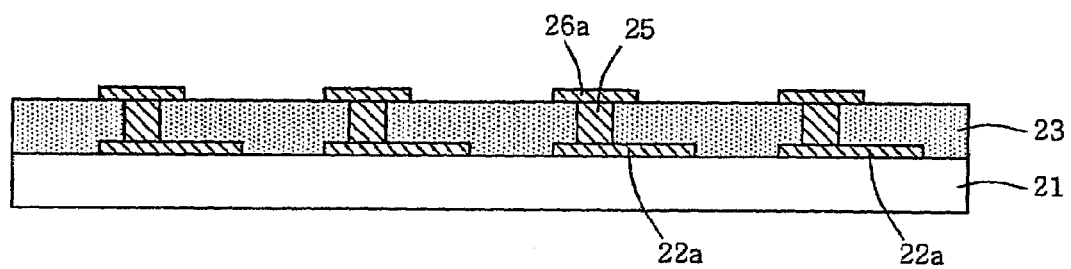
Figure 3A:
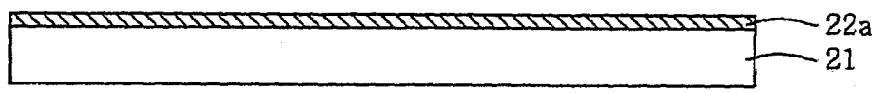
FIGS. 3a to 3f are sectional views illustrating the fabrication of the three-dimensional inductor, according to the conventional technology.
Figure 3B:
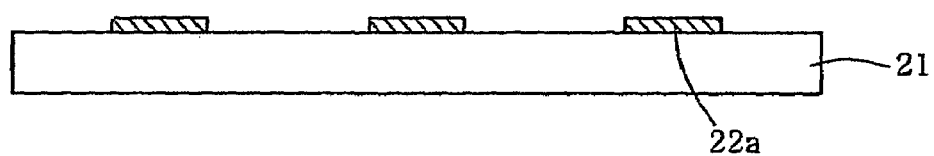
Figure 3C:
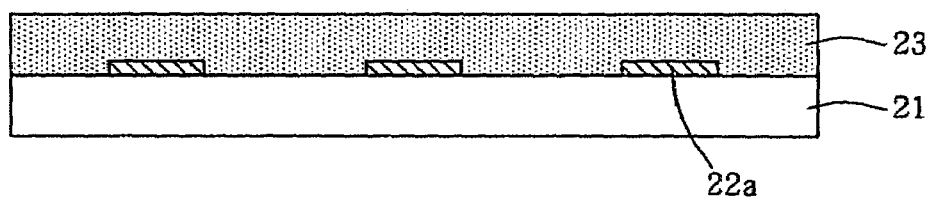
Figure 3D:
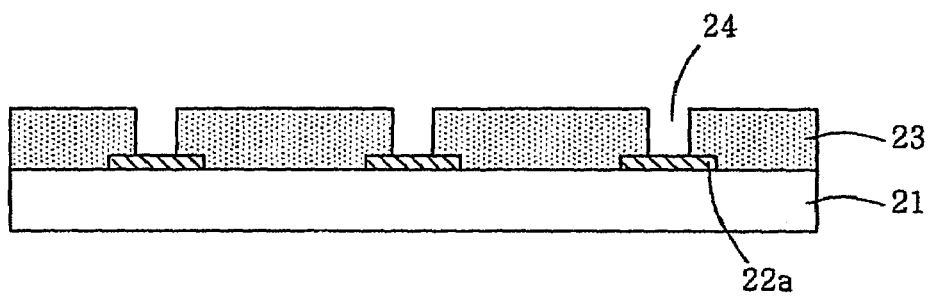
Figure 3E:
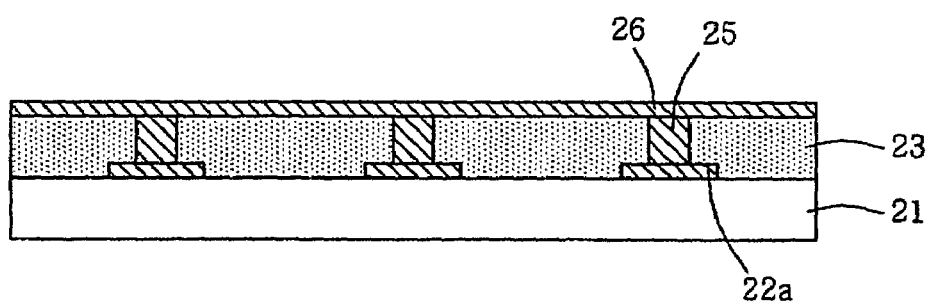
Figure 3F:
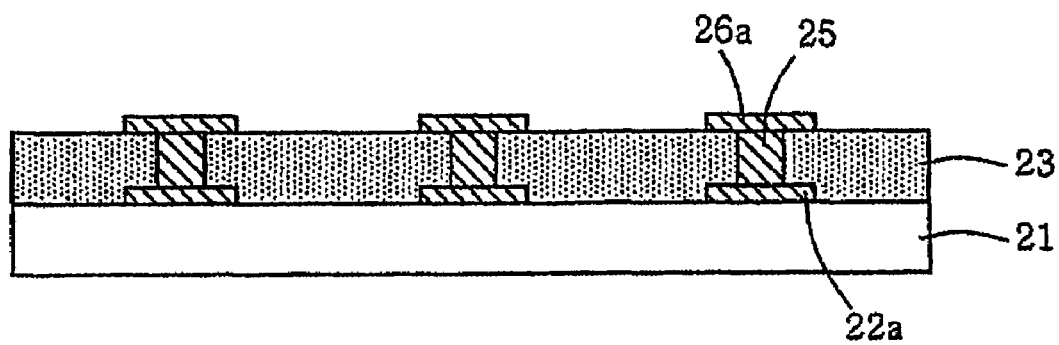
Figure 4:
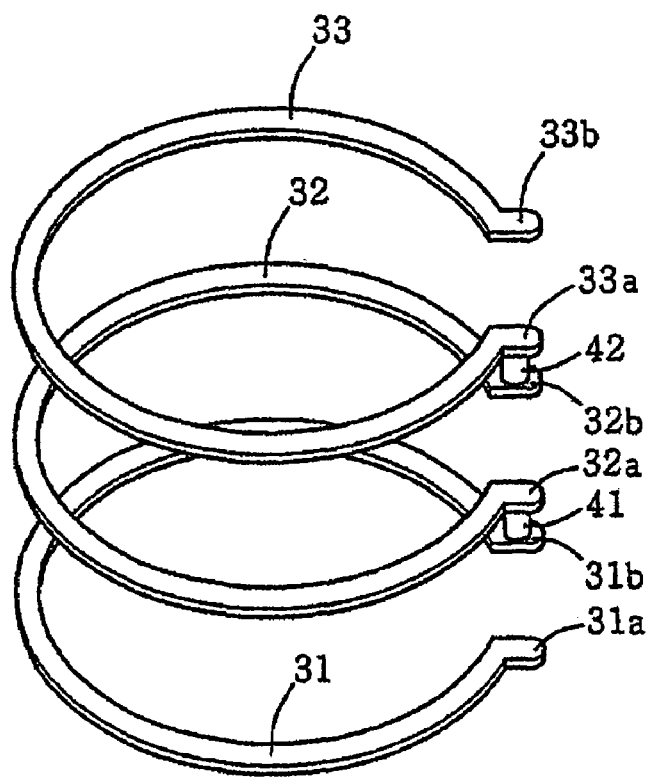
FIG. 4 illustrates a ring-shaped inductor, in which ring-shaped structures are parallelly arranged, according to the conventional technology.
Figure 5:
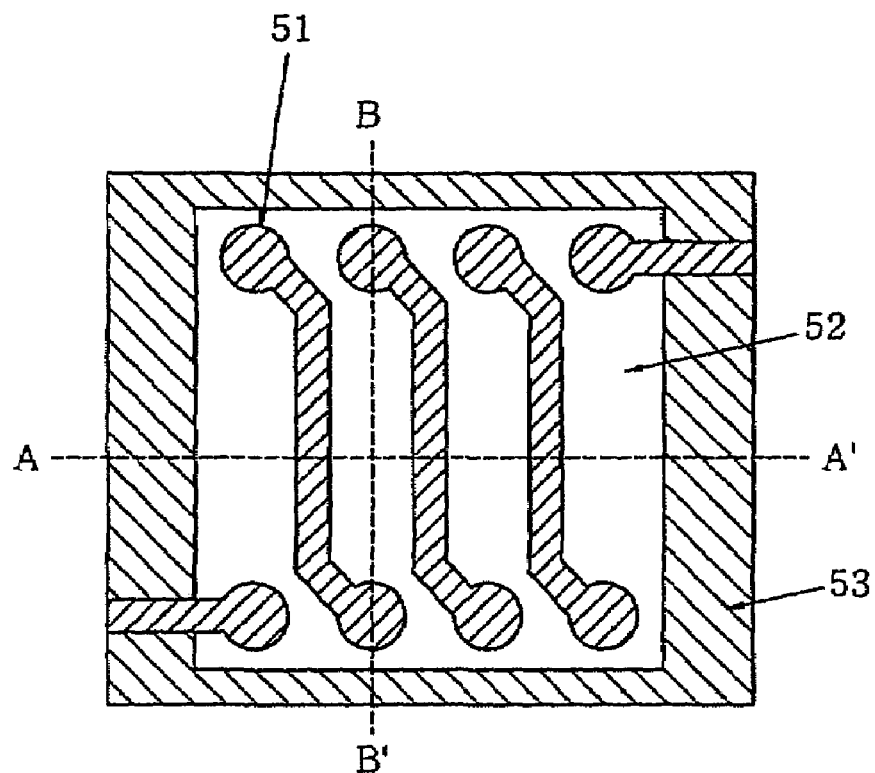
FIG. 5 illustrates a three-dimensional inductor structure according to another conventional technology.
Figure 6:
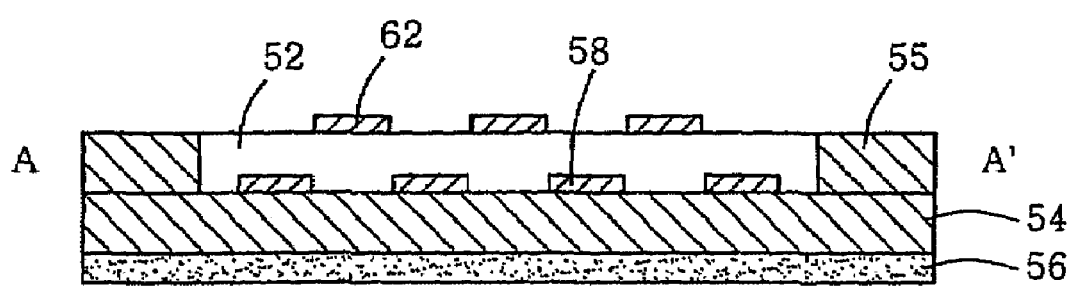
FIG. 6 is a sectional view taken along the line A–A' of FIG. 5.
Figure 7:
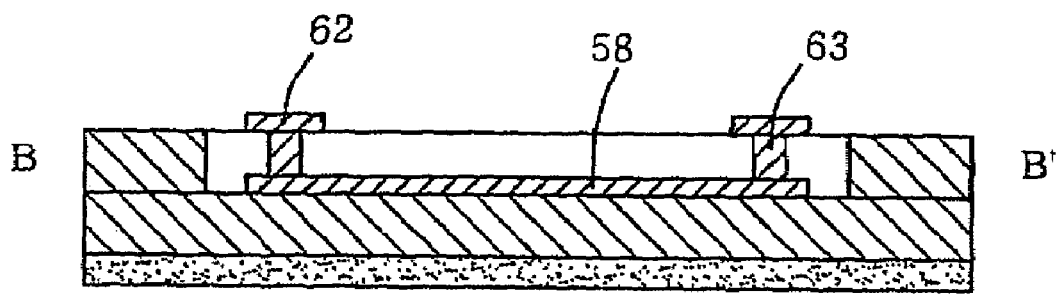
FIG. 7 is a sectional view taken along the line B–B' of FIG. 5.
Figure 8:
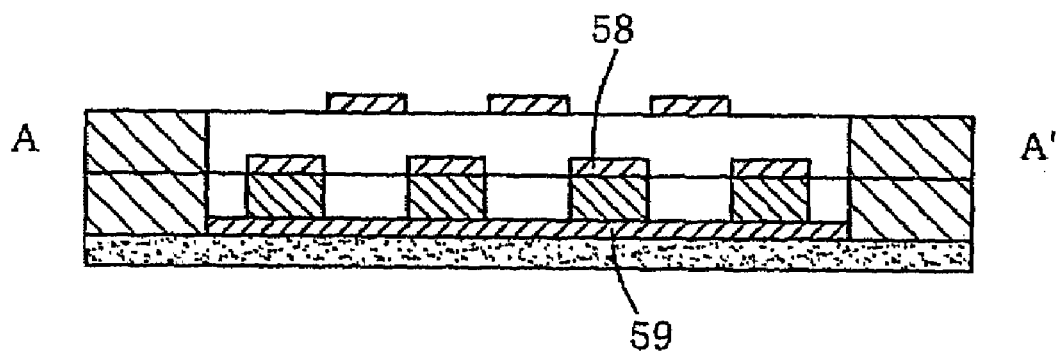
FIG. 8 illustrates a modified embodiment of the three-dimensional inductor structure of FIG. 5.
Figure 9:
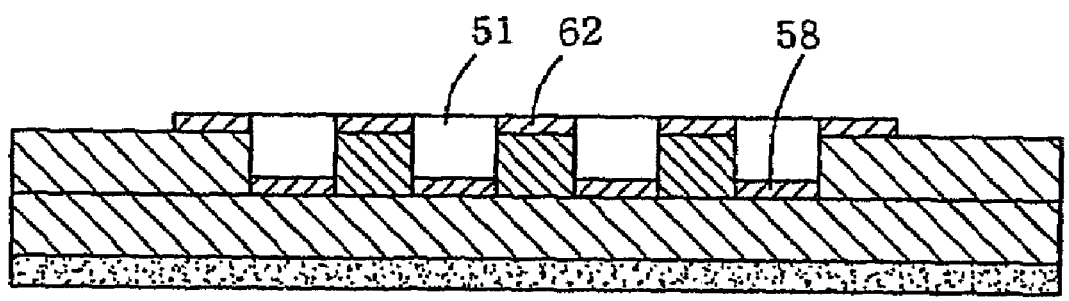
FIG. 9 illustrates another modified embodiment of the three-dimensional inductor structure of FIG. 5.
Figure 10:
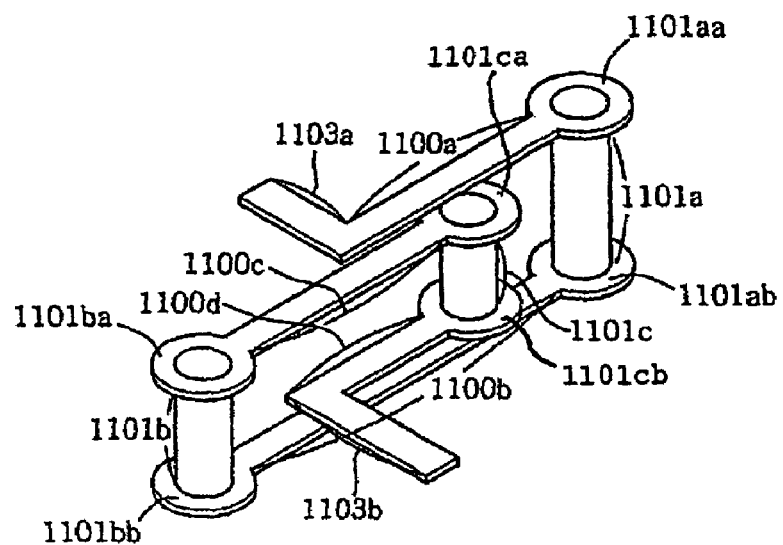
FIG. 10 is a perspective view of a four-layered three-dimensional inductor, which is used in a PCB having the three-dimensional spiral inductor according to an embodiment of the present invention.

FIG. 10 is a perspective view of a four-layered three-dimensional inductor, which is used in a PCB comprising the three-dimensional spiral inductor according to an embodiment of the present invention.

Referring to FIG. 10, the three-dimensional inductor, which is used in the PCB having the three-dimensional spiral inductor according to an embodiment of the present invention, is provided with a plurality of coil conductor patterns 1100a–1100d, a plurality of coil via holes 1101a–1101c, and two lead out patterns 1103a, 1103b. Land parts 1101aa and 1101ab, 1101ba and 1101bb, and 1101ca and 1101cb are formed on both ends of the coil via holes 1101a–1101c.

In FIG. 10, the coil conductor patterns 1100a–1100d are shaped in a micro-strip, and separated and parallel to each other.

Furthermore, the coil via holes 1101a–1101c are formed so as to be perpendicular to the coil conductor patterns 1100a–100d, and electrically connect the corresponding coil conductor patterns 1100a–1100d therethrough.

In this respect, electroless and electrolytic copper plating layers are formed on walls of the coil via holes 1101a–1101c to provide conductivity to the via holes, and a paste is packed in the remaining holes of the coil via holes or a fill plating process is conducted for the remaining holes of the coil via holes.

Additionally, the land parts 1101aa and 101ab, 1101ba and 1101bb, and 1101ca and 1101cb are formed on both ends of the coil via holes 1101a–1101c to improve conductivity.

The two lead out patterns 1103a, 1103b, which have the micro-strip shape, are connected to the outermost conductor patterns 1100a, 1100b at right angles to form electric paths between the conductor patterns 1100a, 1100b and externals.

From FIG. 10, it can be seen that the number of winds of the coil is 1.5, and four circuit layers and three coil via holes 1101a–1101c are needed to realize the above number of winds.

Furthermore, each of the coil conductor patterns 1100a–1100d is longer than an adjacent inner coil conductor pattern, thus forming the spiral inductor.

The inductor, which has 1.5 winds, is shown in this embodiment, but it is possible to realize an inductor having more winds.

Needless to say, a plurality of coil conductor patterns 1110a–1100d have almost the same width in this embodiment, but the patterns may have different widths.

In other words, each of a plurality of coil conductor patterns 1100a–1100d may be wider than an adjacent inner coil conductor pattern, or, conversely, each of the patterns may be narrower than the adjacent inner coil conductor pattern. In this case, DC (direct current) resistance and Q values are changed.

With respect to this, in the coil conductor patterns 1100a–110d, if the widths of the patterns on the middle and external layers are larger than that of the pattern on the internal layer, sectional areas of the patterns on the middle and external layers are larger than that of the pattern on the internal layer, and thus, the patterns on the middle and external layers have a DC resistance ratio that is smaller than the pattern on the internal layer. Accordingly, the total DC resistance of the coil conductor patterns is reduced.

When inductance is L, DC resistance is R, and resonance frequency is $f_o$, the Q value is expressed by $Q = 2\pi f_o L/R$, thus the Q value increases.

Examples of material for the conductor patterns 1100a–1100d include Ag, Pd, Cu, Ni, Au, and Ag—Pd.

Furthermore, the coil conductor patterns 1100a–11100d and the coil via holes 1101a–1101c are fabricated using a combination of photolithography, etching, and hole processing technologies. In detail, a copper clad laminate is prepared, through holes are formed to form the coil via holes 1101b, 1101c, electroless and electrolytic copper plating processes are conducted to form plating layers so as to provide conductivity to the through holes, and photoresist layers are formed on the conductor layers. Subsequently, photomasks are layered on the photoresist layers, and then exposed. Next, the exposed resist layers are developed, thus unnecessary portions of the resist layers are removed. The conductor layers are partially removed using an etchant while a portion of the conductor layers, on which the resist layers are layered, is not removed. Thereby, the coil conductor patterns 1100c, 1100d and the lead out pattern 1103b are formed.

Thereafter, insulating layers are laminated on both sides of the coil conductor patterns 1100c, 110d, and a through hole is formed to form the conductor via hole 1101a. Additionally, the through hole is subjected to electroless and electrolytic copper plating processes to have conductivity, and a conductor layer is formed. Subsequently, a conductive paste fills the through hole. The above procedure is repeated to form the coil conductor patterns 1100a, 1100b and the lead out pattern 1103a.

Figure 11:
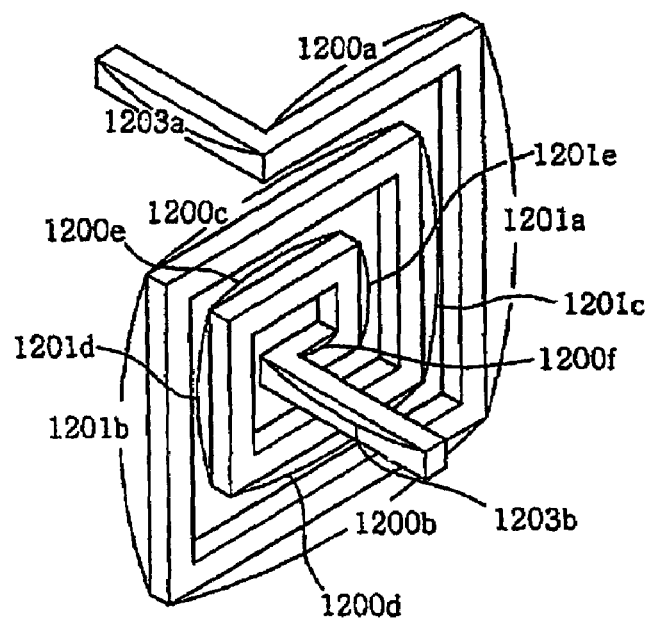
FIG. 11 is a perspective view of a six-layered three-dimensional inductor, which is used in a PCB having the three-dimensional spiral inductor according to another embodiment of the present invention.

FIG. 11 is a perspective view of a six-layered three-dimensional inductor, which is used in a PCB having the three-dimensional spiral inductor according to another embodiment of the present invention.

Referring to FIG. 11, the three-dimensional inductor, which is used in the PCB having the three-dimensional spiral inductor according to the present embodiment of the invention, is provided with a plurality of coil conductor patterns 1200a–1200f, a plurality of coil via holes 1201a–1201e for connecting the coil conductor patterns 1200a–1200f to each other, and two lead out patterns 1203a, 1203b.

From FIG. 10, it can be seen that the number of winds of the coil is 2.5, and six circuit layers and six coil via holes 1201a–1201e are needed to realize the above number of winds.

Furthermore, each of the coil conductor patterns 1200a–1200f is longer than an adjacent inner coil conductor pattern, thus forming the spiral inductor.

The coil conductor patterns 1200a–1200f have almost the same width in this embodiment, but the patterns may have different widths.

In other words, each of a plurality of coil conductor patterns 1200a–1200f may be wider than the adjacent inner coil conductor pattern, or conversely, the patterns may be narrower than the adjacent inner coil conductor pattern. In this case, DC resistance and Q values are changed.

With respect to this, in the coil conductor patterns 1200a–1200f, if the widths of the patterns on the middle and external layers are larger than that of the pattern on the internal layer, sectional areas of the patterns on the middle and external layers are larger than that of the pattern on the internal layer, and thus, the patterns on the middle and external layers have a DC resistance ratio that is smaller than the pattern on the internal layer in the spiral coil conductor patterns 1200a–1200f. Accordingly, the total DC resistance of the coil conductor patterns is reduced and a Q value increases.

Examples of a material of the conductor patterns 1200a–1200f include Ag, Pd, Cu, Ni, Au, and Ag—Pd.

Furthermore, the coil conductor patterns 1200a–1200f and the coil via holes 1201a–1201e are fabricated using a combination of photolithography, etching, and hole processing technologies.

Figure 12:
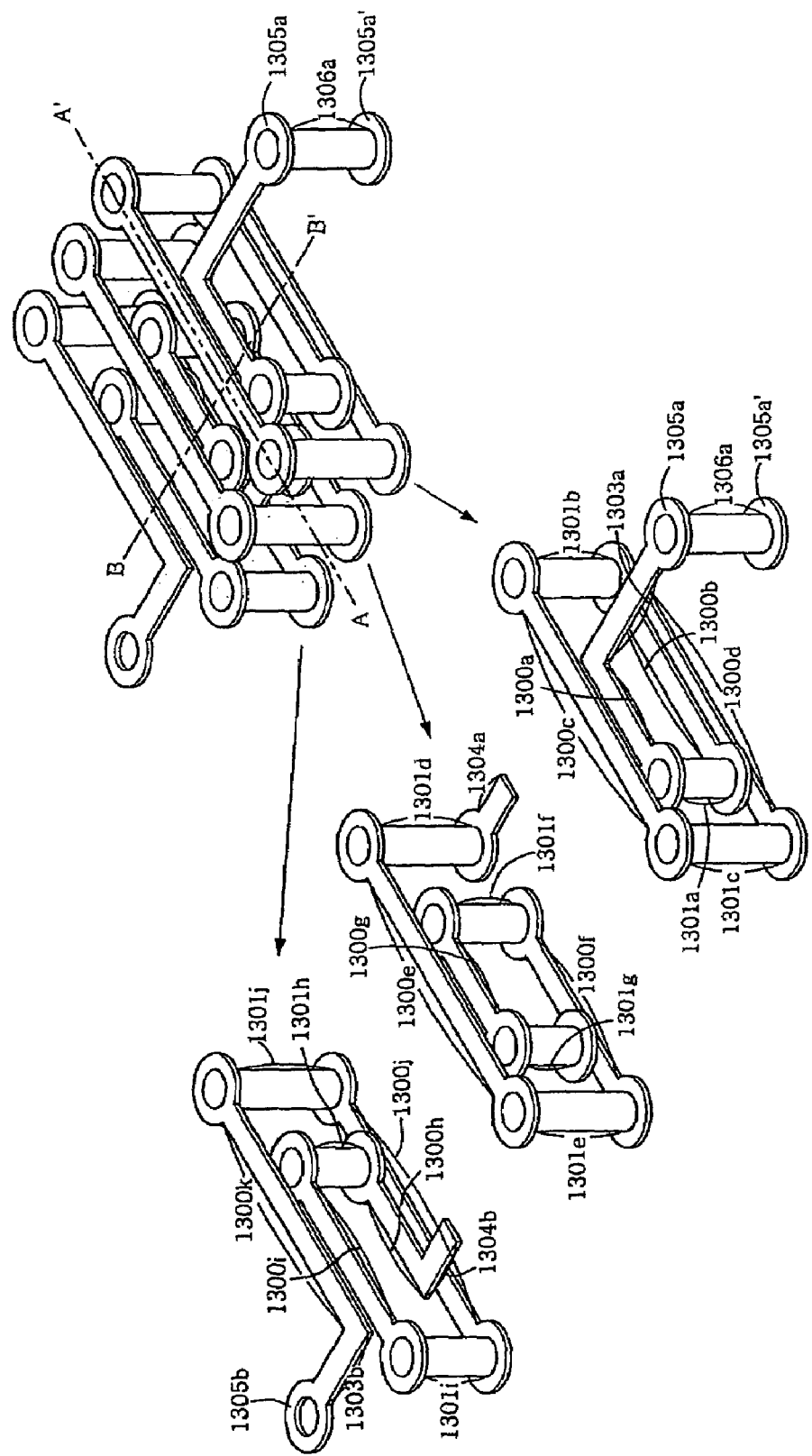
FIG. 12 illustrates a three-dimensional spiral inductor, in which an insulating layer is omitted, according to yet another embodiment of the present invention.

FIG. 12 illustrates a three-dimensional spiral inductor, in which an insulating layer is omitted, according to an embodiment of the present invention.

With reference to FIG. 12, in the present invention, the third embodiment is different from the first and second embodiments in that three spiral structures are parallelly arranged.

In other words, three vertical planes are arranged parallel to each other in the present embodiment of the invention. An inductor part, which includes the spiral structure having 1.75 winds, is formed on each plane. The inductor parts are electrically connected to each other through lead connection patterns 1304a, 1304b.

Of the inductor parts formed on the planes, a description will be given of the first inductor part. The first inductor part is provided with a plurality of coil conductor patterns 1300a–1300d, a plurality of coil via holes 1301a–1301c, and a lead out pattern 1303a. Land parts 1301aa and 1301ab, 1301ba and 1301bb, and 1301ca and 1301cb are formed on both ends of the coil via holes 1301a–1301c.

In an expanded view of the first inductor part, the coil conductor patterns 1300a–1300d are shaped into micro-strips, and parallelly separated from each other.

Furthermore, the coil via holes 1301a–1301c are formed perpendicular to the coil conductor patterns 1300a–1300d, and electrically connect the corresponding coil conductor patterns 1300a–1300d to each other therethrough.

In this respect, electroless and electrolytic copper plating layers are formed on walls of the coil via holes 1301a–1301c to provide conductivity to the via holes, and a paste is packed in the remaining holes of the coil via holes or a fill plating process is conducted for the remaining coil via holes.

Additionally, the land parts 1301aa and 1301ab, 1301ba and 1301bb, and 1301ca and 1301cb are formed on both ends of the coil via holes 1301a–1301c to improve conductivity.

The lead out pattern 1303a, which has the micro-strip shape, is connected to the outermost conductor patterns 1300a, 1300b at right angles to form electric paths between the conductor patterns 1300a, 1300b and externals.

From FIG. 12, it can be seen that the number of winds of the coil is 1.5, and four circuit layers and three coil via holes 1301a–1301c are needed to realize the above number of winds.

Furthermore, each of the coil conductor patterns 1300a–1300d is longer than the adjacent inner coil conductor pattern, thus forming the spiral inductor part.

Each inductor part, which has 1.5 winds, is shown in this embodiment, but it is possible to realize an inductor part having more winds.

Needless to say, coil conductor patterns 1300a–1300d have almost the same width in this embodiment, but the patterns may have different widths.

In other words, coil conductor patterns 1300a–1300d may be wider than the adjacent inner coil conductor pattern, or conversely, the patterns may be narrower than the adjacent inner coil conductor pattern. In this case, DC resistance and Q values are changed.

With respect to this, in the coil conductor patterns 1300a–1300d, if the widths of the patterns on the middle and external layers are larger than that of the pattern on the internal layer, sectional areas of the patterns on the middle and external layers are larger than that of the pattern on the internal layer, and thus, the patterns on the middle and external layers have a DC resistance ratio that is smaller than the pattern on the internal layer. Accordingly, the total DC resistance of the coil conductor patterns is reduced.

Through the above description, the first inductor part is embodied, and the second and third inductor parts may be understood in the same manner.

Particularly, it is required that the separated inductor parts be electrically connected to each other. Referring to the expanded views, the first inductor part is electrically connected through the first lead connection pattern 1304a to the second inductor part, and the second and third inductor parts are electrically connected to each other through the second lead connection pattern 1304b.

The lead connection patterns 1304a, 1304b are connected to the outermost wire and the innermost wire, respectively.

Additionally, the lead connection patterns 1304a, 1304b insignificantly increase inductance but significantly affect parasitic resistance or capacitance. Accordingly, if the lead connection patterns are as narrow as possible, it is possible to minimize the parasitic resistance or capacitance.

Only the three-dimensional spiral inductor, which consists of the three inductor parts, is embodied in the present embodiment of the invention. However, it is possible to design a three-dimensional spiral inductor having more winds.

FIGS. 13a to 13h are sectional views illustrating the fabrication of the inductor of FIG. 12, which are taken along the line A–A' of FIG. 12.

Figure 13A:
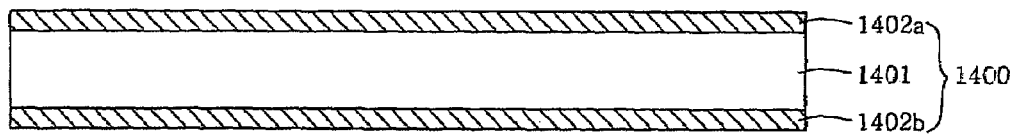
FIGS. 13a to 13h are sectional views illustrating the fabrication of the inductor of FIG. 12 taken along the line A–A' of FIG. 12.

With reference to FIG. 13a, a copper clad laminate 1400, which consists of an insulating layer 1401 and copper foils 1402a, 1402b formed on both sides of the insulating layer, is prepared.

Figure 13B:
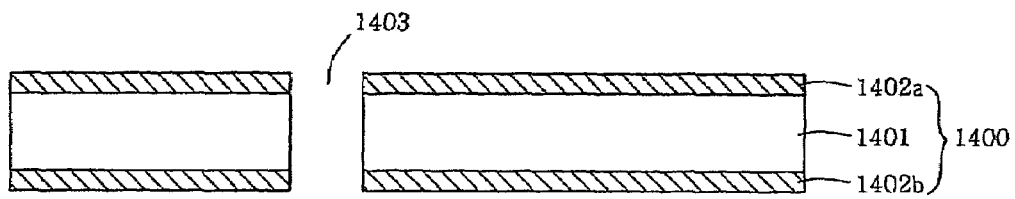

Referring to FIG. 13b, a through hole 1403 is formed using a mechanical or laser drill so as to form a coil via hole for electrically connecting the copper foils which constitute both sides of the copper clad laminate 1400.

Figure 13C:
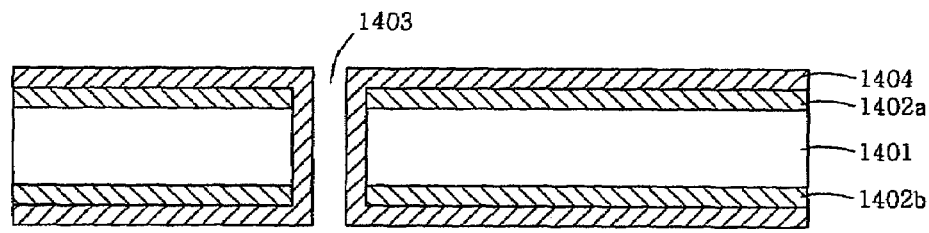
Figure 13D:
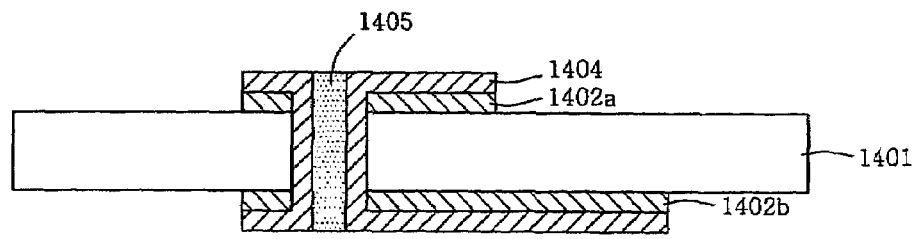

Referring to FIG. 13c, electroless and electrolytic copper plating processes are implemented to form plating layers 1404, thereby providing conductivity to the through hole 1403. As shown in FIG. 13d, a conductive paste is packed in the through hole 1403 or a fill plating process is conducted for the through hole so as to improve conductivity.

Subsequently, after photoresist layers have been formed on the copper foils 1402a, 1402b, photomasks are layered on the photoresist layers, and then exposed.

Next, the exposed resist layers are developed, thus unnecessary portions of the resist layers are removed.

The conductor layers are partially removed using an etchant while a portion of the conductor layers, on which the resist layers are layered, is not removed. Thereby, an internal layer coil conductor pattern and a lead out pattern are formed.

Figure 13E:
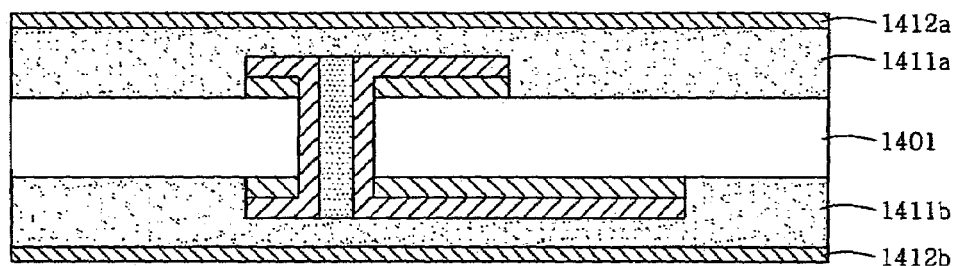
Figure 13F:
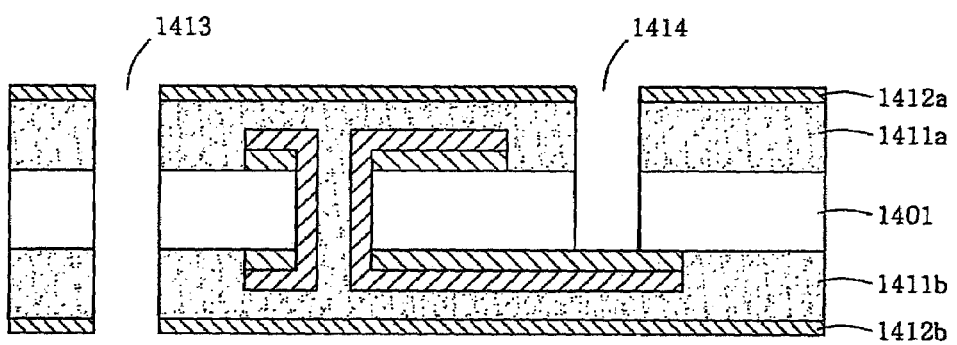
Figure 13G:
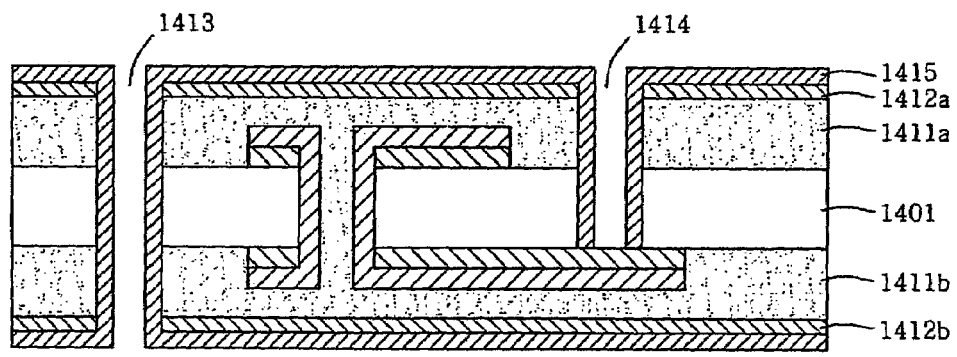

As shown in FIG. 13e, insulating layers 1411a, 1411b and copper foils 1412a, 1412b are laminated on both sides of the coil conductor pattern, and, as shown in FIG. 13f, through holes 1413, 1414 are formed to form coil via holes. As shown in FIG. 13g, electroless and electrolytic copper plating processes are conducted to form plating layers 1415, thereby providing conductivity to the through holes 1413, 1414.

Figure 13H:
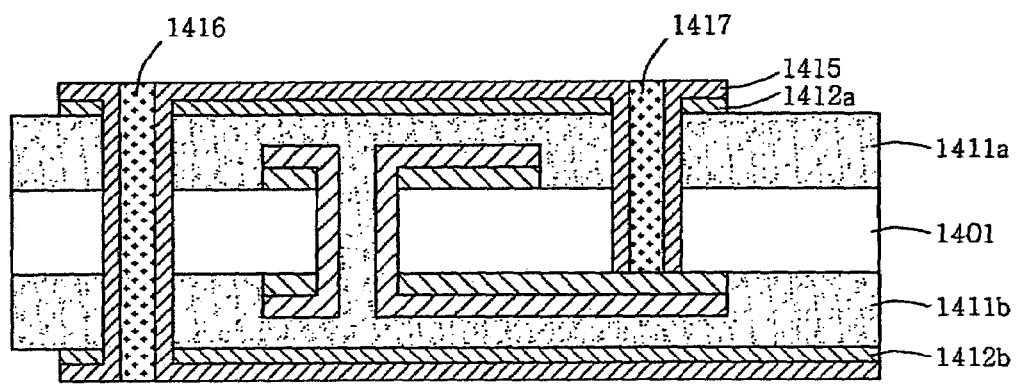

As shown in FIG. 13h, a conductive paste is packed in the through holes 1413, 1414, or a fill plating process is implemented for the through holes so as to improve conductivity.

After photoresist layers have been formed on the electroless and electrolytic copper plating layers 1415, photomasks are layered on the photoresist layers and then exposed.

Next, the exposed resist layers are developed, thus an unnecessary portion of the resist layers is removed. The conductor layers are partially removed using an etchant while the portion of the conductor layers on which the resist layers have been layered is not removed. Thereby, an external layer coil conductor pattern and a lead out pattern are formed.

FIGS. 14a to 14f are sectional views illustrating the fabrication of the inductor of FIG. 12, which are taken along the line B–B' of FIG. 12.

Figure 14A:
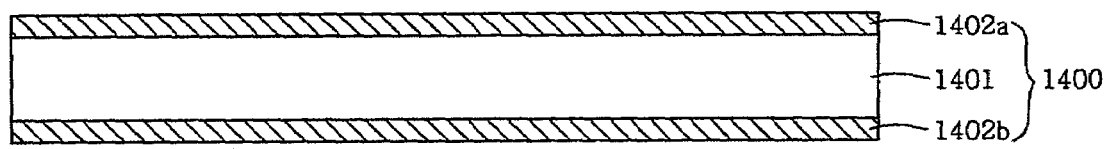
FIGS. 14a to 14f are sectional views illustrating the fabrication of the inductor of FIG. 12 taken along the line B–B' of FIG. 12.

With reference to FIG. 14a, a copper clad laminate 1400, which consists of an insulating layer 1401 and copper foils 1402a, 1402b formed on both sides of the insulating layer, is prepared.

As in FIG. 13b, a through hole 1403 is formed using a mechanical or laser drill so as to form a coil via hole for electrically connecting the copper foils which constitute both sides of the copper clad laminate 1400. At this stage, the shape of the copper clad laminate is not changed because the through hole 1403 is not positioned at the section of the inductor which is taken along the line B–B'.

Figure 14B:
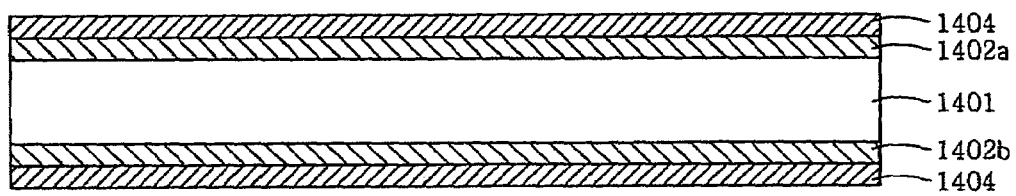

Referring to FIG. 14b, electroless and electrolytic copper plating processes are implemented to form plating layers 1404, thereby providing conductivity to the through hole 1403 in FIG. 13b.

Figure 14C:
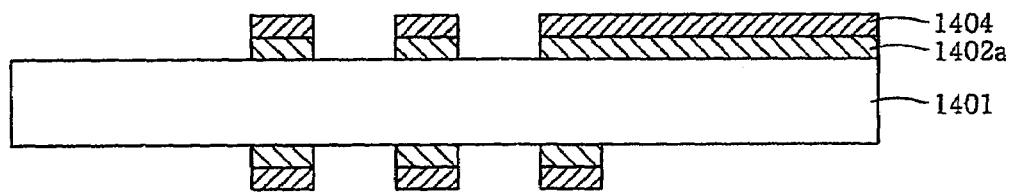

As shown in FIGS. 14b and 14c, after photoresist layers have been formed on the copper foils 1402a, 1402b, photomasks are layered on the photoresist layers and then exposed.

Subsequently, the exposed resist layers are developed, thus unnecessary portions of the resist layers are removed.

The conductor layers are partially removed using an etchant while the portion of the conductor layers on which the resist layers have been layered is not removed. Thereby, an internal layer coil conductor pattern and a lead out pattern are formed.

Figure 14D:
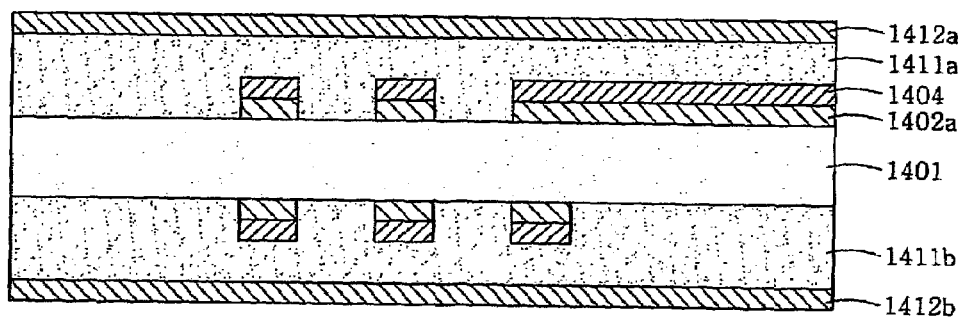
Figure 14E:
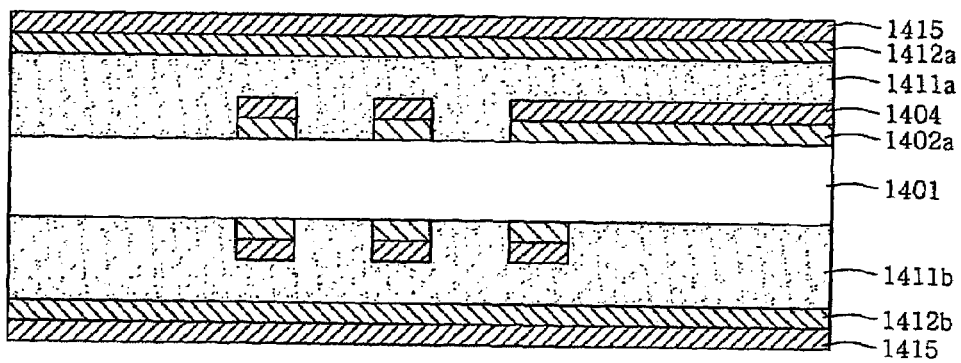

As shown in FIG. 14d, insulating layers 1411a, 1411b and copper foils 1412a, 1412b are laminated on both sides of the coil conductor pattern. As shown in FIG. 14e, electroless and electrolytic copper plating processes are conducted to form plating layers 1415, thereby providing conductivity to through holes for the formation of the coil via holes of FIG. 13f.

Figure 14F:
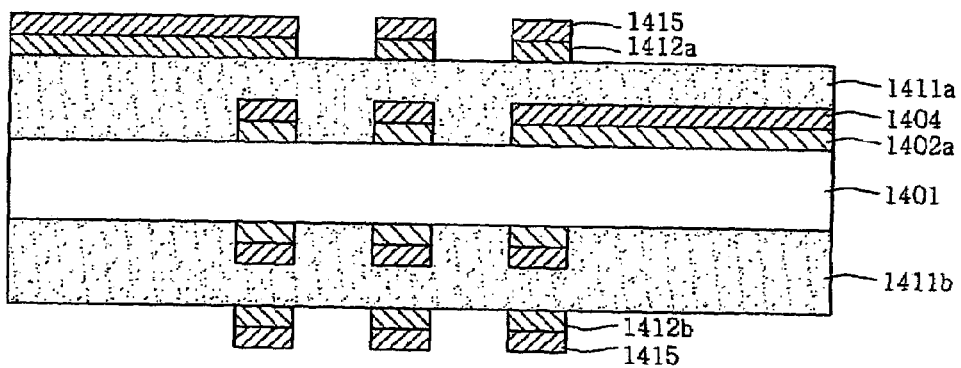

As shown in FIG. 14f, after photoresist layers are formed on the electroless and electrolytic copper plating layers 1415, photomasks are layered on the photoresist layers and then exposed.

Next, the exposed resist layers are developed, thus an unnecessary portion of the resist layers is removed. The conductor layers are partially removed using an etchant while the portion of the conductor layers on which the resist layers have been layered is not removed. Thereby, an external layer coil conductor pattern and a lead out pattern are formed.

Figure 15A:
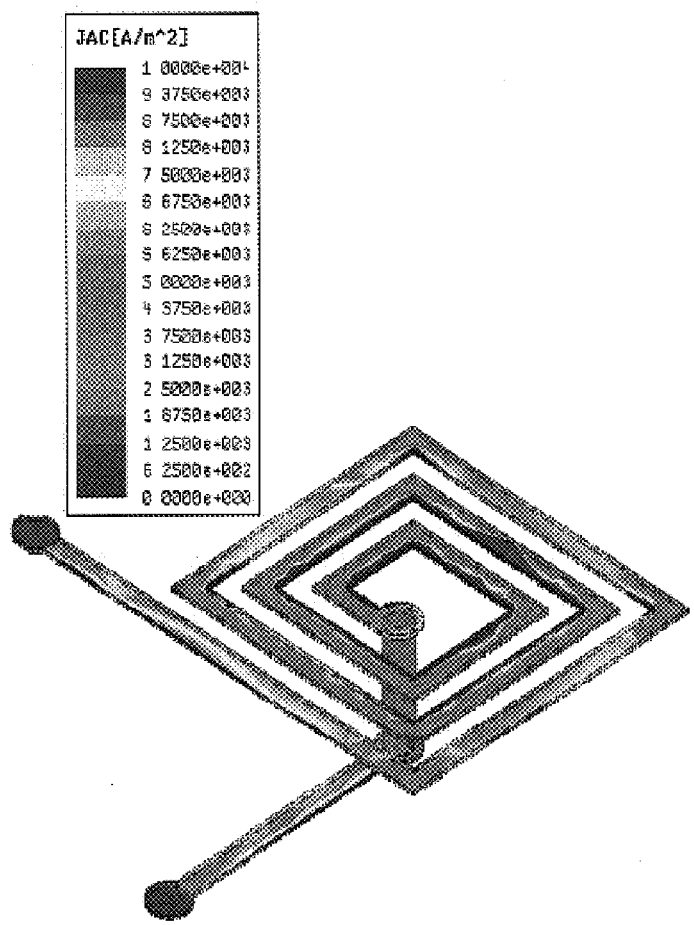
FIG. 15a is a perspective view of the conventional spiral inductor, in which an insulating layer is omitted.
Figure 16A:
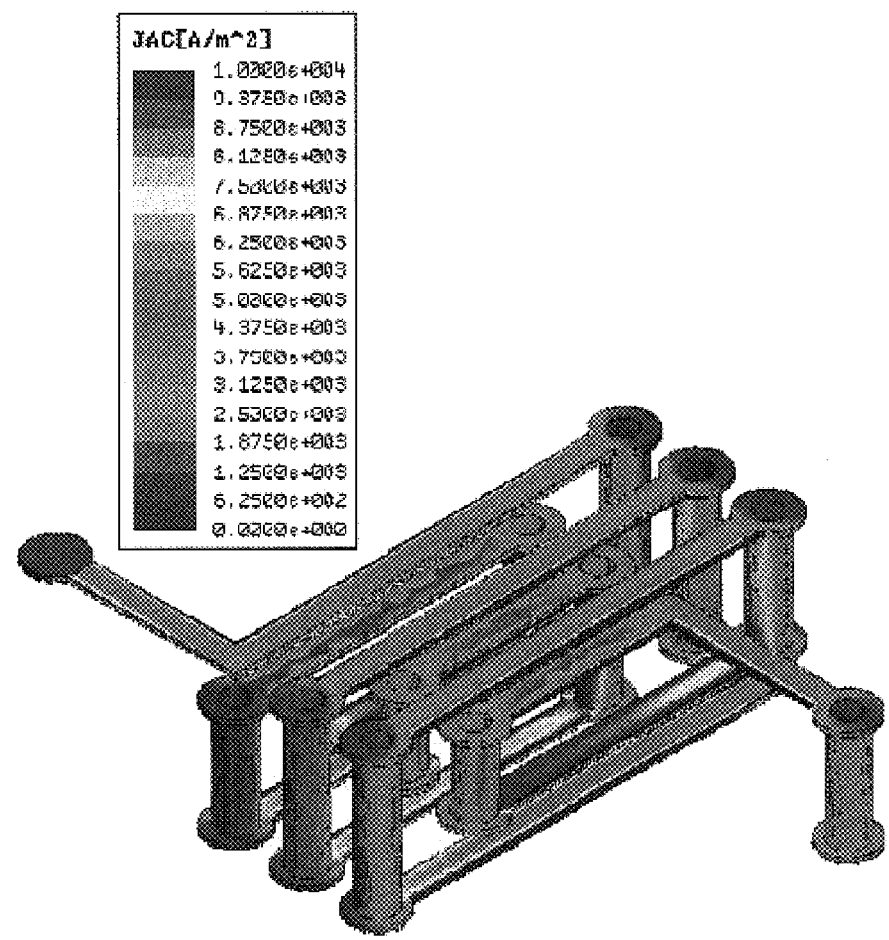
FIG. 16a is a perspective view of the three-dimensional spiral inductor according to the present invention, which has a transversely expanded structure and in which an insulating layer is omitted.

FIG. 15a is a perspective view of a conventional spiral inductor, which has 3 winds, and FIG. 16a illustrates a three-dimensional spiral inductor according to the present invention, which has a transversely expanded structure and 10 winds. In FIGS. 15a and 16a, an insulating layer is omitted. In these figures, a color change means a current density change. An explanatory note shows which color corresponds to what current density.

Figure 15B:
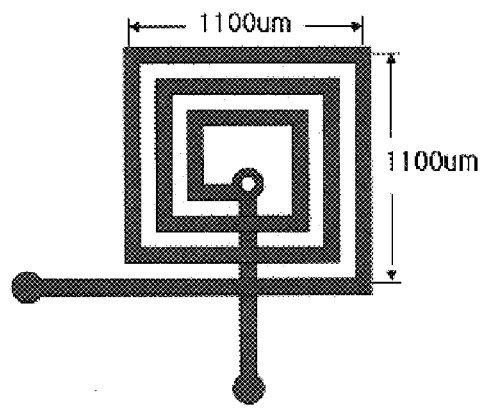
FIG. 15b is a plan view of the conventional spiral inductor of FIG. 15a, in which the insulating layer is omitted.

FIG. 15b is a plan view of the conventional spiral inductor of FIG. 15a. In this figure, the insulating layer is not shown. From FIG. 15b, it can be seen that the conventional spiral inductor has an area of 1100 μm×1100 μm.

Figure 16B:
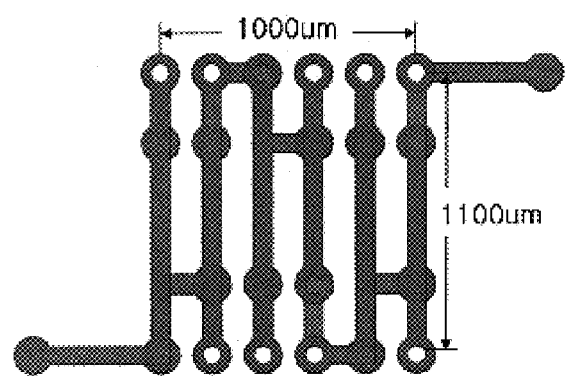
FIG. 16b is a plan view of the three-dimensional spiral inductor according to the present invention shown in FIG. 15b, which has the transversely expanded structure.

Furthermore, FIG. 16b illustrates the three-dimensional spiral inductor of the present invention, which has the transversely expanded structure, of FIG. 16a. FIG. 16b shows that an area of the three-dimensional spiral inductor is 1000 μm×1100 μm.

From FIGS. 15a to 16b, it can be seen that the conventional spiral inductor has 3 winds while the three-dimensional spiral inductor of the present invention has 10 winds, which is 7 more than the conventional inductor in the same area. Inductance and capacitance values of the conventional inductor and the inductor of the present invention are comparatively described in Table 1.

TABLE 1

|  | Inductance (nH) | Capacitance (pF) |
| --- | --- | --- |
| Conventional spiral inductor | 9.06 | 0.0566 |
| Spiral 3-D inductor of the present invention | 20.78 | 0.0673 |
| Increase | Increased by 129% | Increased by 19% |

From Table 1, it can be seen that the three-dimensional spiral inductor of the present invention has inductance that is twice as high or more as the conventional inductor.

Even though the inductor of the present invention has desirably high inductance, it is slightly higher than the conventional inductor with respect to capacitance, which is a disadvantageous factor of the inductor.

Hereinafter, it will be described how a smaller area is required in the inductor of the present invention when inductances of the conventional inductor and the inductor of the present invention are the same.

Figure 17A:
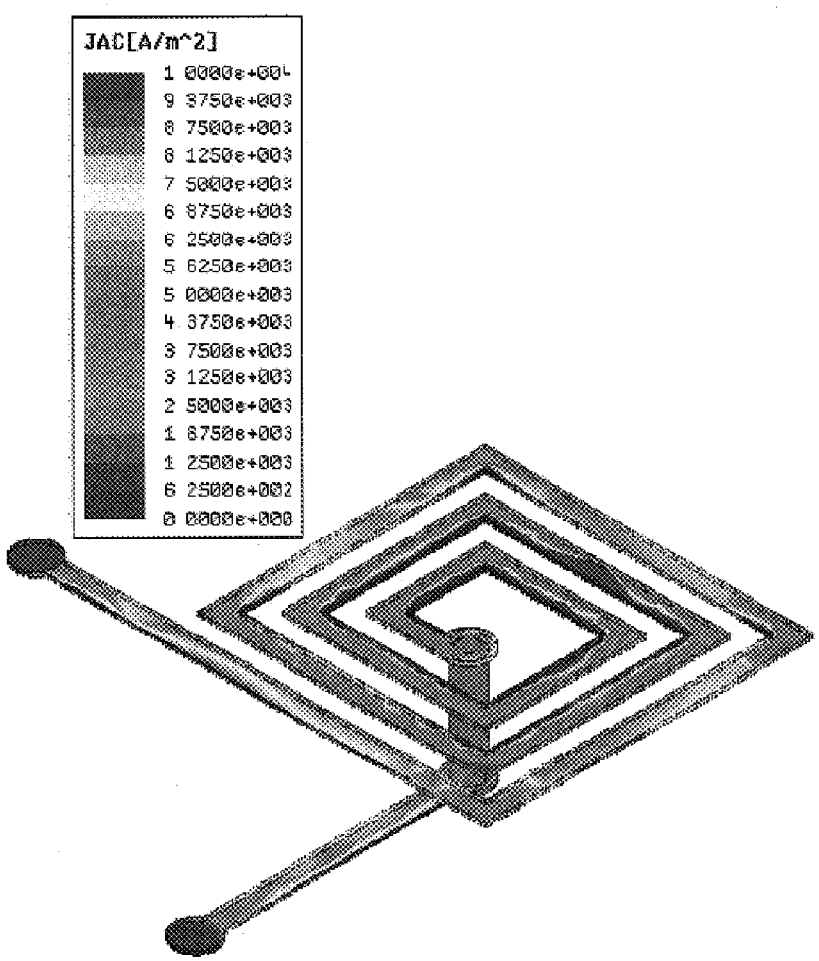
FIG. 17a is a perspective view of the conventional spiral inductor, in which the insulating layer is omitted.
Figure 18A:
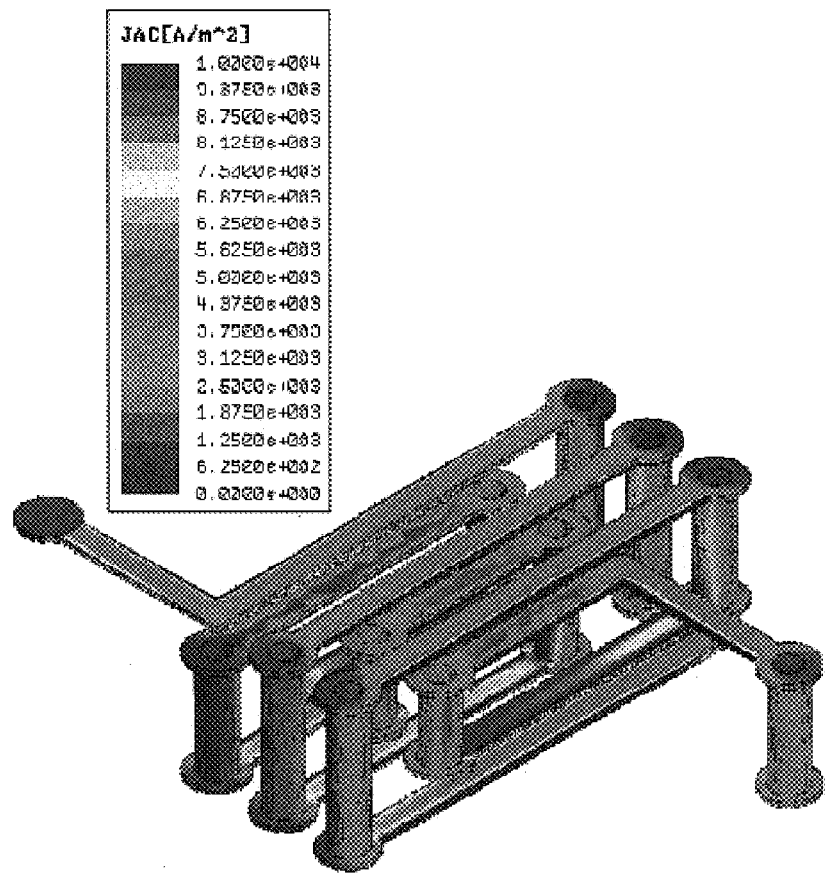
FIG. 18a is a perspective view of the three-dimensional spiral inductor according to the present invention, which has the transversely expanded structure and in which the insulating layer is omitted.

FIG. 17a is a perspective view of the conventional spiral inductor, which has 3 winds, and FIG. 18a illustrates the three-dimensional spiral inductor according to the present invention, which has the transversely expanded structure and 5 winds. In FIGS. 17a and 18a, an insulating layer is omitted. An explanatory note shows which color corresponds to what current density.

Figure 17B:
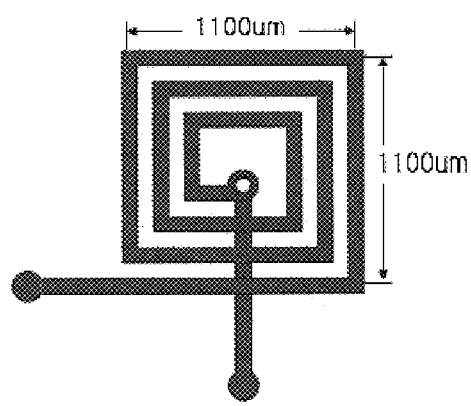
FIG. 17b is a plan view of the conventional spiral inductor of FIG. 17a, in which the insulating layer is omitted.

As well, FIG. 17b illustrates the conventional spiral inductor of FIG. 17a. In this figure, the insulating layer is not shown. From FIG. 17b, it can be seen that the conventional spiral inductor has an area of 1100 μm×1100 μm. An explanatory note shows which color corresponds to what current density.

Figure 18B:
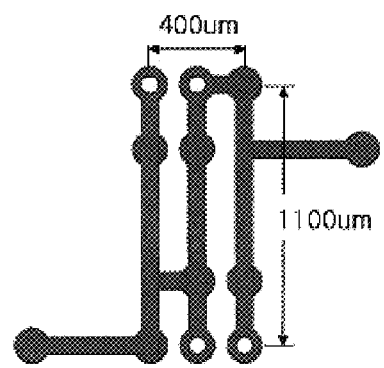
FIG. 18b is a plan view of the three-dimensional spiral inductor according to the present invention shown in FIG. 17b, which has the transversely expanded structure.

In addition, FIG. 18b illustrates the three-dimensional spiral inductor of the present invention having the transversely expanded structure of FIG. 18a. FIG. 18b shows that an area of the three-dimensional spiral inductor is 400 μm×1100 μm which is reduced by 63% in comparison with the conventional spiral inductor shown in FIG. 17a.

From FIGS. 17a to 18b, it can be seen that even though the area of the inductor of the present invention is reduced by 63% in comparison with the conventional inductor, the conventional inductor has 3 winds while the three-dimensional inductor of the present invention has 5 winds, which is 2 more than the conventional inductor. Inductance and capacitance values of the conventional inductor and the inductor of the present invention are comparatively described in Table 2.

TABLE 2

|  | Inductance (nH) | Capacitance (pF) | Area (mm²) |
| --- | --- | --- | --- |
| Conventional spiral inductor | 9.06 | 0.0566 | 1.21 |
| Spiral 3-D inductor of the present invention | 9.93 | 0.0540 | 0.44 |
| Increase | 109% | Reduced by 5% | 63.6% |

From Table 2, it can be seen that even though the area of the inductor of the present invention is reduced by 63% in comparison with the conventional inductor, the two inductors have almost the same inductance.

Furthermore, in the inductor of the present invention, capacitance, which is a disadvantageous factor of the inductor, is reduced in comparison with the conventional inductor, unlike inductance which is increased.

Although a PCB having a three-dimensional inductor and a method of fabricating the same according to the embodiments of the present invention have been disclosed for illustrative purposes, those skilled in the art will appreciate that various modifications, additions and substitutions are possible, without departing from the scope and spirit of the invention as disclosed in the accompanying claims.

As described above, the present invention is advantageous in that it is possible to realize high inductance in a narrow area of small-sized devices, such as mobile phones or MP3 phones, in which many components are mounted on a narrow substrate.

Another advantage is that it is possible to realize high inductance without an increase in capacitance, which is a disadvantageous factor of the inductor.

What is claimed is:

1. A printed circuit board having a three-dimensional spiral inductor, comprising:
   a plurality of coil conductor patterns provided on a plurality of conductor layers such that the plurality of coil conductor patterns are parallel to each other and positioned on a plane perpendicular to the conductor layers, and;
   a plurality of conductive through holes electrically connecting the coil conductor patterns such that the plurality of coil conductor patterns and the plurality of conductive through holes form a spiral conductor all together, and wherein the plurality of coil conductor patterns are longer than an adjacent inner coil conductor pattern of the spiral conductor; and
   a pair of lead out patterns connected to an inner end and an outer end of the spiral conductor to allow external power to be supplied to the spiral conductor.

2. The printed circuit board as set forth in claim 1, wherein the plurality of conductive through holes is filled with a conductive material.

3. The printed circuit board as set forth in claim 1, wherein plating layers are formed on walls of the plurality of conductive through holes.

4. The printed circuit board as set forth in claim 1, wherein each of the coil conductor patterns is wider than the adjacent inner coil conductor pattern.

5. The printed circuit board as set forth in claim 1, wherein the printed circuit board has a plurality of three-dimensional spiral inductors, each three-dimensional spiral inductor adjacently positioned and spirally extended in opposite directions and wherein the plurality of conductive through holes are provided on each of the three-dimensional spiral inductors to electrically connect them.

6. The printed circuit board as set forth in claim 1, wherein the spiral inductors positioned on two adjacent planes are spirally extended in opposite directions.

7. The printed circuit board as set forth in claim 5, wherein the plurality of three-dimensional spiral inductors adjacently positioned are spirally extended in the same direction.

8. The printed circuit board as set forth in claim 1, wherein the printed circuit board having a three-dimensional spiral inductor further comprises a plurality of insulating layers adjacent the plurality of conductor layers.

* * * * *